United States Patent
Faul et al.

(10) Patent No.: US 7,915,713 B2
(45) Date of Patent: Mar. 29, 2011

(54) FIELD EFFECT TRANSISTORS WITH CHANNELS ORIENTED TO DIFFERENT CRYSTAL PLANES

(75) Inventors: Juergen Faul, Radebeul (DE); Juergen Holz, Dresden (DE)

(73) Assignee: Qimonda AG, Munich (DE)

( * ) Notice: Subject to any disclaimer, the term of this patent is extended or adjusted under 35 U.S.C. 154(b) by 205 days.

(21) Appl. No.: 12/182,419

(22) Filed: Jul. 30, 2008

(65) Prior Publication Data

US 2010/0025826 A1 Feb. 4, 2010

(51) Int. Cl.
*H01L 29/04* (2006.01)
(52) U.S. Cl. ........ 257/627; 257/151; 257/153; 257/331; 257/366; 257/387; 257/E29.003; 257/E21.186; 257/E21.621; 257/E21.635; 257/E21.638; 257/E21.458; 257/E21.205
(58) Field of Classification Search ................. 257/151, 257/153, 249, 320, 366, 387, 412, E21.186, 257/E21.374, E21.621, E21.635, E21.638, 257/627; 438/179, 158, 299, 303, 305, 592, 438/652, 587
See application file for complete search history.

(56) References Cited

U.S. PATENT DOCUMENTS

| 4,119,996 | A | * | 10/1978 | Jhabvala | 257/334 |
| 5,905,283 | A | * | 5/1999 | Kasai | 257/334 |
| 6,245,615 | B1 | | 6/2001 | Noble et al. | |
| 6,580,154 | B2 | | 6/2003 | Noble et al. | |
| 6,657,259 | B2 | | 12/2003 | Fried et al. | |
| 6,995,456 | B2 | | 2/2006 | Nowak | |
| 7,148,559 | B2 | | 12/2006 | Chan et al. | |
| 2002/0185676 | A1 | * | 12/2002 | Momose | 257/327 |
| 2006/0049430 | A1 | | 3/2006 | Kasai et al. | |
| 2007/0181980 | A1 | * | 8/2007 | Dyer et al. | 257/627 |
| 2007/0222022 | A1 | | 9/2007 | Takeda | |

* cited by examiner

*Primary Examiner* — Wael M Fahmy
*Assistant Examiner* — Marc Armand
(74) *Attorney, Agent, or Firm* — Edell, Shapiro & Finnan, LLC

(57) ABSTRACT

An integrated circuit includes a first field effect transistor of a first carrier type and a second field effect transistor of a second, different carrier type. In a conductive state, a first channel of the first field effect transistor is oriented to one of a first set of equivalent crystal planes of a semiconductor substrate and a second channel of the second field effect transistor is oriented to at least one of a second, different set of equivalent crystal planes. The first set of equivalent crystal planes is parallel to a main surface of the semiconductor substrate and the second set of equivalent crystal planes is perpendicular to the main surface.

15 Claims, 5 Drawing Sheets

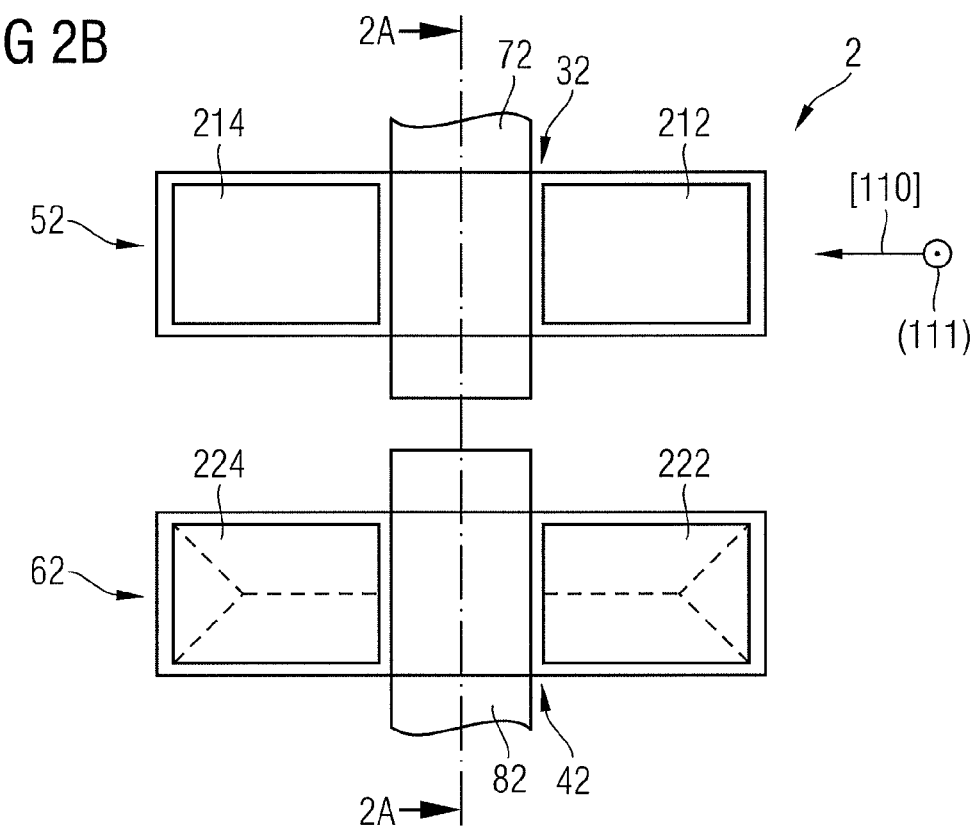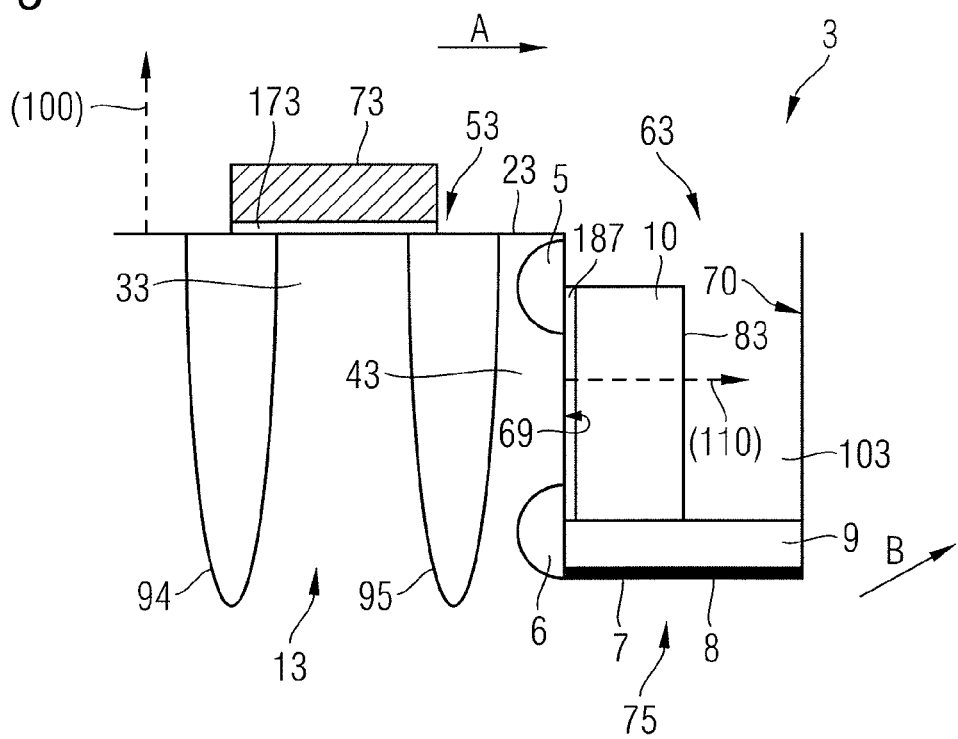

FIELD EFFECT TRANSISTORS WITH CHANNELS ORIENTED TO DIFFERENT CRYSTAL PLANES

BACKGROUND

Field effect transistors (FETs) differ in channel geometry and in their functional parameters (e.g., carrier mobility). In the transistor on-state, a conductive inversion layer (channel) is formed between two source/drain regions of the FET. In planar FETs, the channel is oriented to one single plane, whereas in 3D-channel FETs the channel is oriented to at least two different planes. In an integrated circuit, FETs of different structure and/or with different characteristics may be combined on one single chip.

Conventionally, hybrid substrates with different crystal orientations have been used to fabricate a high performance CMOS (complementary metal oxide semiconductor) structure comprising an n-channel FET (n-FET) and a p-channel FET (p-FET) with matched parameters on one single chip. Manufacturing of hybrid substrates includes complex and time-consuming processes (e.g., direct wafer bonding, etching, and epitaxy).

SUMMARY

An integrated circuit includes a first field effect transistor of a first carrier type and a second field effect transistor of a second, different carrier type. In a conductive state, a first channel of the first field effect transistor is oriented to one of a first set of equivalent crystal planes of a semiconductor substrate and a second channel of the second field effect transistor is oriented to at least one of a second, different set of equivalent crystal planes. The first set of equivalent crystal planes is parallel to a main surface of the semiconductor substrate and the second set of equivalent crystal planes is perpendicular to the main surface.

Another integrated circuit includes a first field effect transistor and a second field effect transistor. A first channel of the first field effect transistor is parallel to a main surface and oriented to one of a first set of equivalent crystal planes of a semiconductor substrate. At least a portion of a second channel of the second field effect transistor is oriented to a second set of equivalent crystal planes tilted with reference to the main surface. A first and second source/drain region of the second field effect transistor are arranged along a direction parallel to the intersection lines of planes of the first and second set.

Another integrated circuit includes a first field effect transistor configured to form, in a conductive state, a first channel oriented to a main surface of a semiconductor substrate, wherein the main surface is parallel to a first set of equivalent crystal planes of the semiconductor substrate. A FinFET is configured to form, in a conductive state, a second channel oriented to a second set of equivalent crystal planes perpendicular to the first set. Portions of a gate electrode of the FinFET are disposed in a groove formed in the semiconductor structures.

A further integrated circuit includes a first field effect transistor of a first carrier type and a second field effect transistor of a second, different carrier type. A first gate electrode of the first field effect transistor is formed in a first gate groove that is defined in a semiconductor substrate. The first gate electrode extends in a horizontal direction between two adjacent first isolation structures. A second gate electrode of the second field effect transistor is formed in a second gate groove defined in the semiconductor substrate. The second gate electrode extends between two adjacent second isolation structures, wherein substrate portions are arranged between the second gate electrode and the second isolation structures, respectively. Sidewalls of the groove extend along different crystal planes of the semiconductor substrate.

A yet further integrated circuit includes a first field effect transistor with a first gate electrode and a second field effect transistor with a second gate electrode. The first gate electrode is disposed along a main surface of a semiconductor substrate and the second gate electrode is disposed in a groove disposed in the semiconductor substrate. The groove comprises a first sidewall along a first crystal plane and a second sidewall along a second crystal plane of the semiconductor substrate in a cross-section along a first direction. A channel formed between a first and a second source/drain region of the second field effect transistor extends in a direction being perpendicular to the first direction.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The accompanying drawings are included to provide a further understanding of embodiments of the present invention and are incorporated in and constitute a part of this specification. The drawings illustrate embodiments of the present invention and together with the description serve to explain the principles. Other embodiments and many of the intended advantages will be readily appreciated as they become better understood by reference to the following detailed description. The elements of the drawings are not necessarily to scale relative to each other. Like reference numerals designate corresponding similar parts.

FIG. 1B illustrates a plan view of the substrate portion of FIG. 1A, wherein FIG. 1A is a cross-section along intersection line A-A of FIG. 1B.

FIG. 2B illustrates a plan view of the substrate portion illustrated in FIG. 2A.

FIG. 3 illustrates a cross-sectional view of a substrate portion that includes a planar FET and a vertical FET that is formed along a vertical groove sidewall according to a further embodiment.

DETAILED DESCRIPTION

In the following detailed description reference is made to the accompanying drawings, which form a part hereof and in which illustrate specific embodiments in which the invention may be practiced. In this regard, directional terminology such as "horizontal," "perpendicular to horizontal," "vertical," "upper," "on top" etc., is used with reference to the orientation of the Figures being described. Since components of embodiments of the present invention can be positioned in a number of different orientations, the directional terminology is used for purposes of illustration and in no way limiting. It is to be understood that other embodiments may be utilized and structural or logical changes may be made without departing from the scope of the present invention. The following detailed description, therefore, is not to be taken in a limiting sense.

Figure 1A:
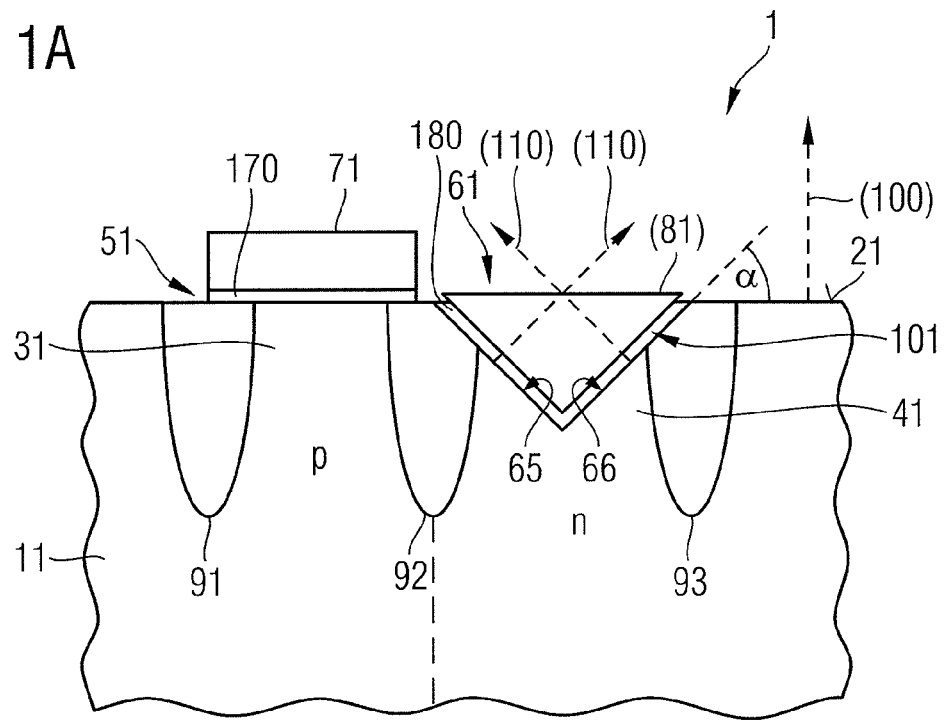
FIG. 1A illustrates a cross-sectional view of a substrate portion that includes a planar p-FET and a 3D-channel n-FET which is oriented to a V-shaped groove in a $\{100\}$-surface of a single-crystalline substrate according to an embodiment.

FIG. 1A illustrates a portion of a semiconductor substrate 11 of an integrated circuit 1. The semiconductor substrate 11 is a crystalline semiconductor material (e.g., silicon, SiGe, germanium or an A(III)-B(V)-semiconductor material) for example with a face-centered cubic crystal lattice. According to an embodiment, the semiconductor substrate 11 is a portion of a preprocessed single crystalline silicon wafer or a silicon-on-insulator wafer and may include further doped and undoped sections, epitaxial semiconductor layers on an insulator or a semiconducting foundation, as well as further conductive and insulating structures that have previously been fabricated. Devices and structural components may already be formed in the semiconductor substrate 11. The semiconductor substrate 11 includes a horizontal main surface 21 on top that is defined as that surface of the semiconductor substrate 11, which is exposed to pattern forming lithography techniques and on which functional circuits are formed. The main surface 21 is oriented to one of a first set of equivalent crystal planes of the semiconductor substrate 11, for example to one of the {100}-planes as illustrated, to one of the {111}-planes, or to one of the {110}-planes.

A first and a second active area 31, 41 may be defined in the semiconductor substrate 11, for example by forming first, second and third isolation structures 91, 92, 93 of an insulating material. The second isolation structure 92 may electrically insulate the adjacent first and second active areas 31, 41 from each other. The first and third isolation structures 91, 93 separate laterally the active areas 31, 41 from further regions of the semiconductor substrate 11. Between the first and second isolation structures 91 and 92, a first field effect transistor 51 of a first carrier type (i.e., of an n- or p-charge carrier type) may be formed. The first field effect transistor 51 is configured to form, in a conductive state, a first channel oriented to one of a first set of equivalent crystal planes of the semiconductor substrate 11. The first active area 31 may include a p-type body region (channel zone) and the first field effect transistor 51 may be a planar n-FET.

A first gate electrode 71 of the first field effect transistor 51 extends in parallel to the main surface 21. A first gate dielectric 170 is disposed between the first gate electrode 71 and the first active area 31. The first gate electrode 71 may be disposed completely on or above the main surface 21 of the semiconductor substrate 11. Alternatively, at least a portion of the first gate electrode 71 may be disposed below the main surface 21 to form a partially or completely buried structure.

A second field effect transistor 61 of a second, different carrier type (i.e., of a p- or n-charge carrier type different from the carrier type of the first field effect transistor 51) may be arranged adjacent to the first field effect transistor 51. The second field effect transistor 61 is configured to form, in a conductive state, a second channel at least a portion of which is oriented to a second set of parallel crystal planes of the semiconductor substrate 11. The second field effect transistor 61 may be a 3D-channel p-FET and may be formed between the second and third isolation structures 92 and 93. According to other embodiments, further semiconducting or insulating structures may be disposed between the first and the second field effect transistors 51, 61.

A second gate electrode 81 of the second field effect transistor 61 is partially or completely formed in a groove 101 formed in the semiconductor substrate 11. A second gate dielectric 180 is arranged between the second gate electrode 81 and the second active area 41. A first 65 and a second 66 sidewall of the groove 101 may form a V-like shape in the cross-sectional plane. The V-shape may be pointed or rounded. The sidewalls 65, 66 may be approximately straight or inwardly or outwardly bowed. The first sidewall 65 may be formed along a first crystal plane and the second sidewall 66 along a second crystal plane of the semiconductor substrate 11 in a cross-section along a first direction, respectively, wherein the first and the second crystal planes belong to one or two second sets of equivalent crystal planes which differ from the first set of equivalent crystal planes. Both the first sidewall 65 and the second sidewall 66 may be oriented along one of the {110}-planes of the semiconductor substrate 11. In a face-centered cube lattice, the first and the second sidewalls 65, 66 may be tilted at an angle α of 45 degree in relation to the main surface 21. Optionally, only one of the first and second sidewalls 65, 66 of the groove 101 may formed along a crystal plane of the semiconductor substrate 11, wherein the other one of the first and second sidewalls 65, 66 may not be formed along a crystal plane of the semiconductor substrate.

The second gate electrode 81 may fill the groove 101 completely or in parts, for example, may fill only a lower portion of the groove 101, or may protrude above the main surface 21. V-shaped grooves in a face-centered cube lattice may be formed via a KOH-etch which etches selectively to the crystal orientation. Then, a thermal oxidation may be performed to form the gate dielectric 180. Thereafter, a gate conductor material may be deposited and patterned to form the gate electrodes 71, 81.

Figure 1B:
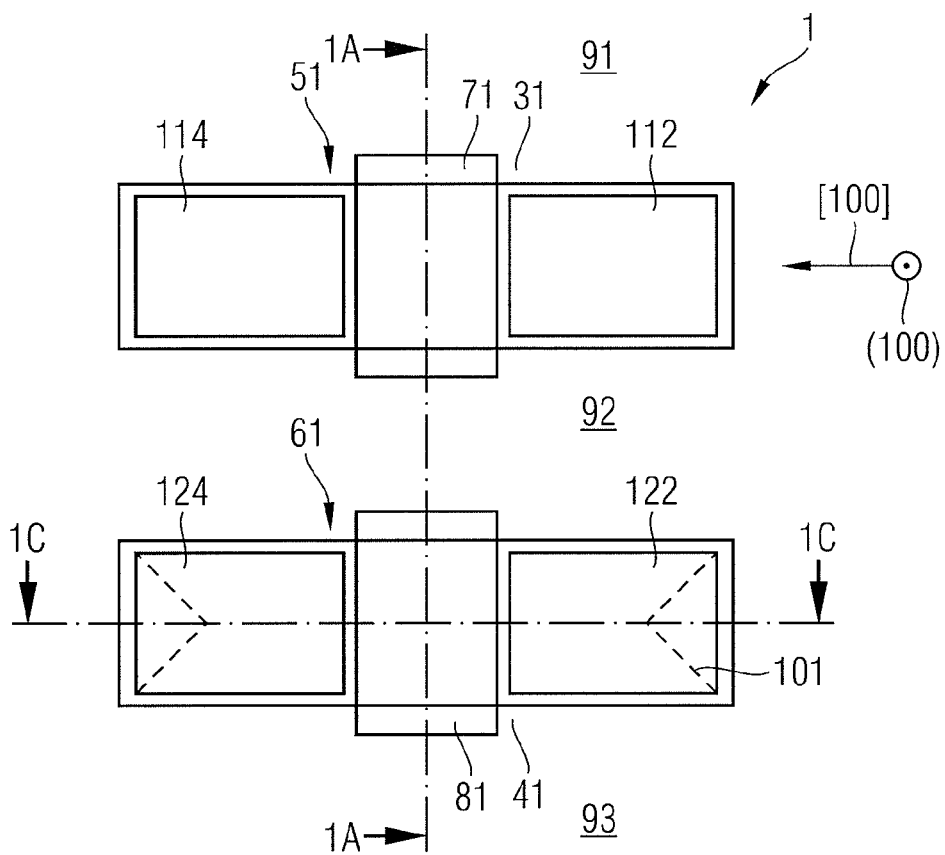

According to the plan view illustrated in FIG. 1B, first and second source/drain regions 112, 114 of the first field effect transistor 51 face each other on opposing sides of the first gate electrode 71 in the first active area 31. First and second source/drain regions 122, 124 of the second field effect transistor 61 face each other on opposing sides of the second gate electrode 81 in the second active area 41. The first and second source/drain regions 122, 124 of the second field effect transistor 61 may be formed in parts or completely under the groove 101 as illustrated or at least in parts in portions of the second active area 41 that directly adjoin the front and end walls of the groove 101. The first gate electrode 71 is formed between the first and second source/drain regions 112, 114 and is configured to control a first channel between the first and the second source/drain regions 112, 114 in the first active area 31. The first channel extends in parallel to the main surface 21 and is oriented to one of the first set of equivalent crystal planes of the semiconductor substrate 11, for example, the main surface 21. The second gate electrode 81 is formed between the first and second source/drain regions 122, 124, may bridge the groove 101, and is configured to control a second channel between a first and a second source/drain region 122, 124 in the second active area 41. The second channel extends in a direction being perpendicular to the above referenced first direction of the groove 101. In the first and second channels a current flows along the same crystal axis but on crystal planes of different orientation. As the carrier mobilities for electrons and holes differ from each other on different crystal planes in a different manner, parameters of n-FETs and p-FETs may be matched.

For example, the integrated circuit 1 may comprise in one silicon substrate 11 a p-FET 61 having a channel formed along a (110)-surface of the groove 101 and an n-FET 51 formed on (100) silicon, respectively, because the integrated circuit 1 comprises different surfaces on one substrate 11. This way, both the p-FET 61 as well as the n-FET 51 exhibit very good performance, although they are integrated in one integrated circuit 1 in one substrate 11. Accordingly, no special processed substrates are required for the integrated circuit 1. Moreover, the integrated circuit 1 has a reduced device foot print due to the formation of the channel of the second field effect transistor 61 under the groove 101. In another example, another integrated circuit may comprise in one silicon substrate an n-FET with a channel formed along a (100)-surface of the groove 101 and a p-FET formed on (110) silicon, respectively. This way, both the n-FET as well as the p-FET exhibit very good performance, although they are integrated in one integrated circuit in one substrate. As described above, this example of an integrated circuit shows also a reduced device footprint since, due to the groove 101, the lateral extension of the second field effect transistor, the channel of which is formed under the groove 101, can be reduced in comparison with the lateral extension of the first field effect transistor the channel of which extending along the main surface 21 of the substrate.

Figure 1C:
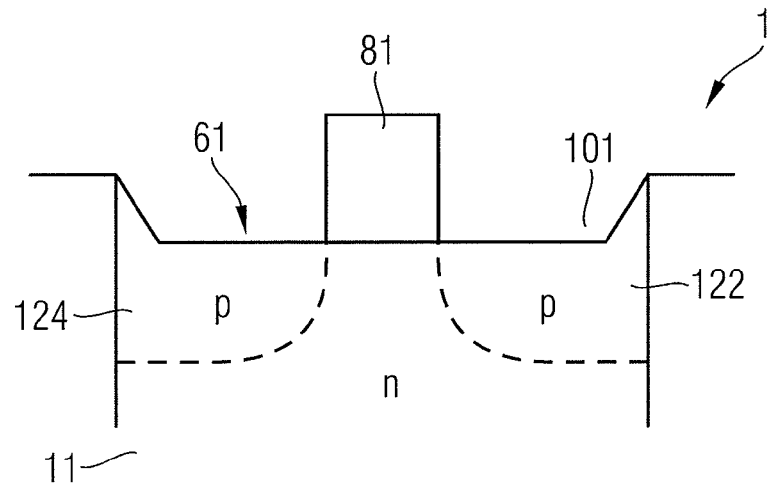
FIG. 1C illustrates a cross-sectional view of the substrate portion of FIG. 1B along line C-C of FIG. 1B.

According to FIG. 1C, which refers to a cross-sectional view through the groove 101 along line C-C of FIG. 1B and perpendicular to that of FIG. 1A, the first and the second source/drain regions 122, 124 of the second field effect transistor 61 may be formed as p-type regions within an n-doped well in the semiconductor substrate 11. The second gate electrode 81 may bridge a section of the groove 101, for example a central section, and is capable of controlling a conductive channel between the first and second source/drain regions 122, 124.

Figure 1D:
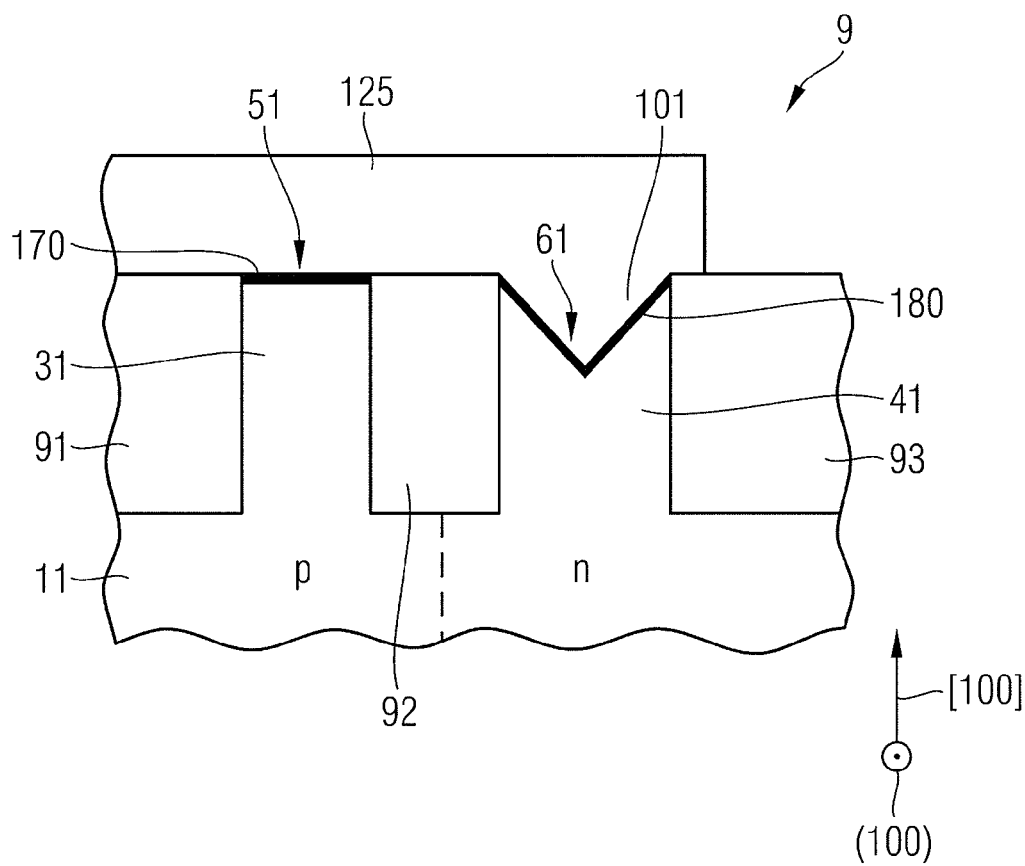
FIG. 1D illustrates a cross-sectional view of an inverter structure that includes a planar p-FET and a 3D-channel n-FET oriented to a V-shaped groove in a $\{100\}$-surface of a single-crystalline substrate according to another embodiment.
Figure 1E:
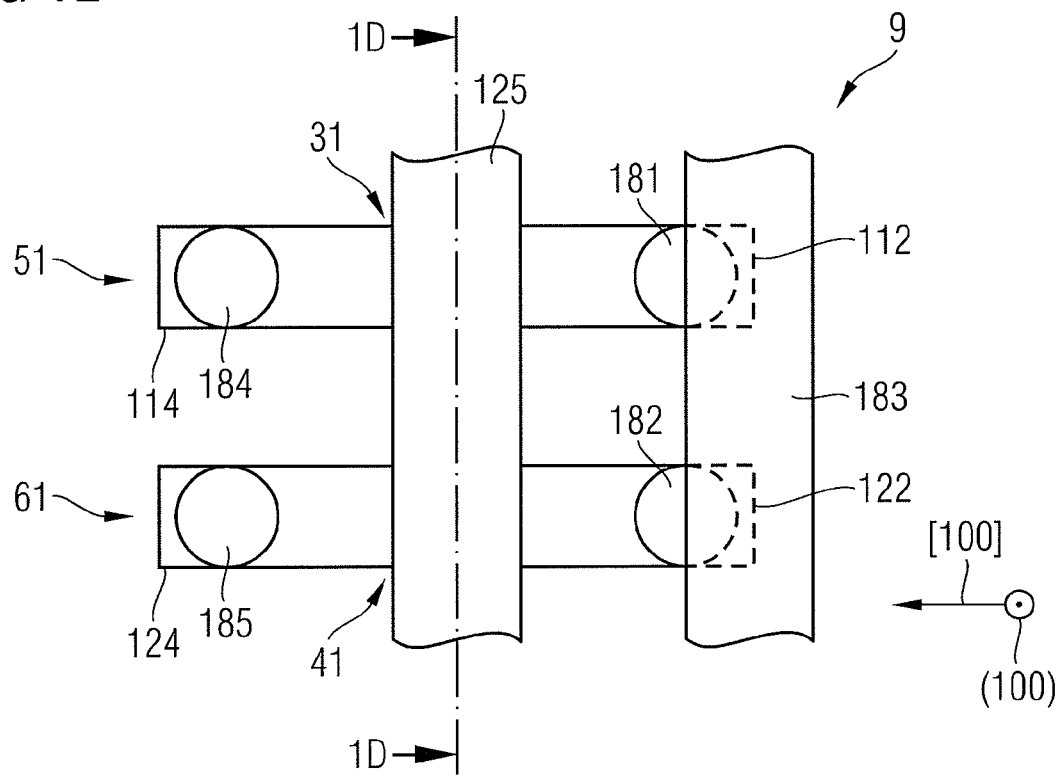
FIG. 1E illustrates a plan view of the inverter structure of FIG. 1D.

FIG. 1D refers to an inverter structure 9 that includes a first, planar n-FET 51 and a second, 3D-channel p-FET 61 oriented to a V-shaped groove 101 in a {100}-surface of a single crystalline semiconductor substrate, wherein FIG. 1D is a cross-section along line 1D-1D of FIG. 1E. Portions of a conductive line 125 are effective as the gate electrodes of the first and second field effect transistor 51, 61 such that the gate electrode of the first field effect transistor 51 and the gate electrode of the second field effect transistor 61 are directly electrically coupled to each other. The first and second field effect transistors 51, 61, the semiconductor substrate 11, isolation structures 91, 92, 93 and gate dielectrics 170, 180 of FIG. 1D may correspond substantially to the first and the second field effect transistors 51, 61, the semiconductor substrate 11, the isolation structures 91, 92, 93 and the gate dielectrics 170, 180 of FIGS. 1A to 1C.

According to FIG. 1E, the first and second source/drain regions 112, 114 of the first field effect transistor 51 are electrically coupled to a first and a second contact structure 181, 184 and the first and second source/drain regions 122, 124 of the second field effect transistor 61 are electrically coupled to a third and a fourth contact structure 182, 185, wherein a conductive line 183 connects the first contact structure 181 and the third contact structure 182.

Figure 2A:
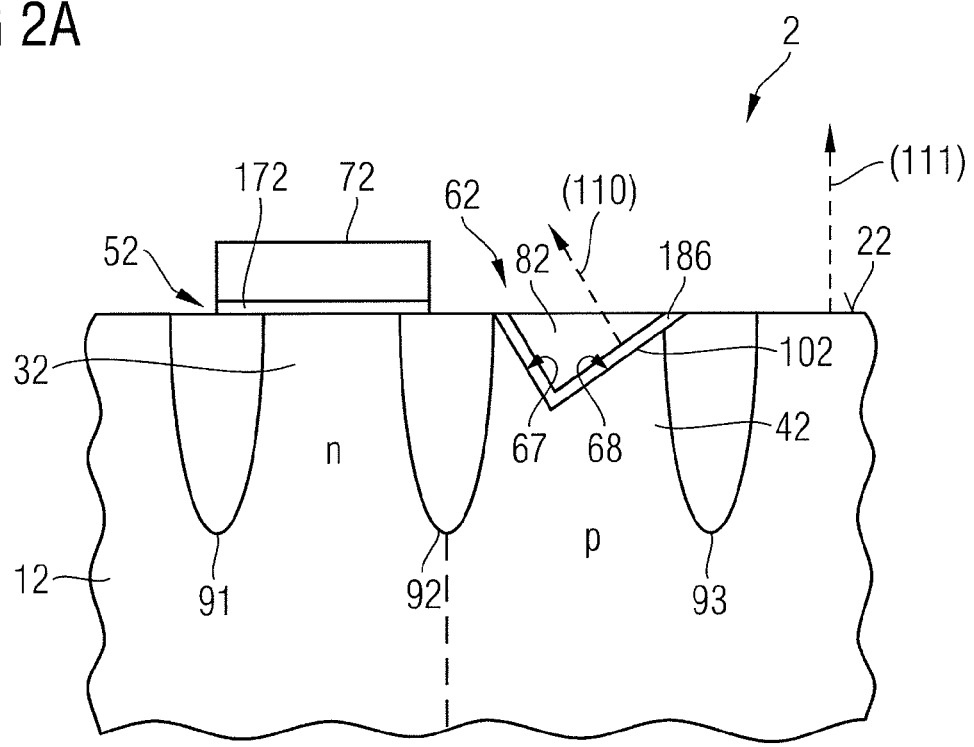
FIG. 2A illustrates a cross-sectional view of a substrate portion that includes a planar n-FET and a 3D-channel p-FET oriented to a V-shaped groove in a $\{111\}$-surface of a single-crystalline substrate according to another embodiment.

FIG. 2A refers to an integrated circuit 2 which is in part formed in a portion of a semiconductor substrate 12 with a horizontal main surface 22, which may be oriented to one of the {111}-planes of the semiconductor substrate 12. A first gate electrode 72 of a first field effect transistor 52 extends in parallel to the main surface 22. A first gate dielectric 172 is arranged between the first gate electrode 72 and a first active area 32 that is formed in the semiconductor substrate 12 between isolation structures 91 and 92. The isolation structures 91, 92 may be isolation trenches. An isolation trench may be formed with various sidewalls, wherein the sidewalls of an isolation trench can be vertical or tilted with reference to the main surface 22 of the substrate 11, and wherein the sidewalls of an isolation trench can be straight or bowed. A body region of the first active area 32 may be an n-type region and the first field effect transistor 52 may be a p-FET, the gate electrode of which is configured to control a first channel extending in a plane parallel to the main surface 22 between a first source/drain region and a second source/drain region of the first field effect transistor 52 in the first active area 32.

A second gate electrode 82 of a second field effect transistor 62, for example an n-FET is formed in a groove 102 defined in the semiconductor substrate 12 between isolation structures 92 and 93. A second gate dielectric 186 is arranged between the second gate electrode 82 and a second active area 42 of the semiconductor substrate 12. The second active area 42 may be a p-type region and the second gate electrode 82 is configured to control a second channel extending in a direction perpendicular to the cross-sectional line between a first and a second source/drain region formed in the second active area 42.

The groove 102 comprises a first sidewall 67 along a first crystal plane and a second sidewall 68 along a second crystal plane. The first and second sidewalls 67, 68 may be oriented along {110}-planes in a face-centered cube lattice, wherein the first and second sidewalls 67, 68 are tilted at an angle of 35° and at an angle of 55°, respectively, in relation to the main surface 22. The second gate electrode 82 may be formed completely or partially within the groove 102. An upper edge of the gate electrode 82 may be flush with the main surface 22 or may protrude above the main surface 22. According to another embodiment, a further insulating structure is arranged between the upper edge of the gate electrode 82 and the main surface 22.

According to the plan view of the substrate portion illustrated in FIG. 2B, the first and second source/drain regions 212, 214 of the first field effect transistor 52 are formed in the first active area 32 below the main surface 22, and the first and second source/drain regions 222, 224 of the second field effect transistor 62 are formed in the second active area 42 below and/or adjoining the groove 102. The first gate electrode 72 is formed between the first and second source/drain regions 212, 214 of the first field effect transistor 52, and the second gate electrode 82 is formed between the first and second source/drain regions 222, 224 of the second field effect transistor 62 and may bridge the groove 102 completely or may be formed in a lower portion of the groove 102 only.

According to a further embodiment, one of the source/drain regions 212, 214 of the first field effect transistor 52 and one of the source/drain regions 222, 224 of the second field effect transistor 62, as well as the first and the second gate electrodes 72, 82 may be electrically coupled to each other to form an inverter structure.

FIG. 3 refers to an integrated circuit 3 which is in part formed in a portion of a semiconductor substrate 13, which may be one as described above, for example a single crystalline silicon substrate. The semiconductor substrate 13 comprises a horizontal main surface 23, which is parallel to one of a first set of equivalent crystal planes of the semiconductor substrate 13. According to the illustrated embodiment, the main surface 23 is parallel to the {100}-planes of the semiconductor substrate 13.

A first field effect transistor 53 of a first carrier type is formed in and on the semiconductor substrate 13. The first field effect transistor 53 is configured to form, in a conductive state, a first channel oriented to one of a first set of equivalent crystal planes of the semiconductor substrate 13. The first field effect transistor 53 may be a planar n-FET. In other embodiments, the first field effect transistor 53 is a planar p-FET. The first field effect transistor 53 comprises a first active area 33 with a first and a second source/drain region, wherein the first active area 33 may be defined between a first and a second isolation structure 94, 95. A first gate electrode 73 and a first gate dielectric 173 of the first field effect transistor 53 are disposed along the main surface 23, wherein the first gate electrode 73 is configured to control a first channel formed between the first and the second source/drain regions in the first active area 33 in a transistor on-state. The first channel extends in parallel to the main surface 23 and a current in the channel flows along an axis perpendicular to the cross-sectional plane.

A second field effect transistor 63 which may be arranged in or on the same semiconductor substrate 13 as the first field effect transistor 53, is of a second, different carrier type, for example a p-FET. The second field effect transistor 63 may be arranged in the vicinity of the first field effect transistor 53. For example, the second field effect transistor 63 may be formed adjacent to the first field effect transistor 53, wherein the first and the second field effect transistor 63 are separated from each other by the isolation structure 95. The second field effect transistor 63 is configured to form, in a conductive state, a second channel oriented to at least one of a second, different set of equivalent crystal planes of the semiconductor substrate 13. In accordance with other embodiments, the second field effect transistor 63 is of the same type as the first field effect transistor. A second gate electrode 83 of the second field effect transistor 63 is configured to control a second channel between a first and a second source/drain region 5, 6 in a second active area 43 of the second field effect transistor 63. The second channel is oriented to a second set of equivalent crystal planes of the semiconductor substrate 13 (e.g., the {110}-planes) and a current in the second channel flows along a vertical axis perpendicular to the main surface 23 in the transistor on-state.

A second gate electrode 83 and a second gate dielectric 187 of the second field effect transistor 63 are disposed in a groove 103 defined in the main surface 23 of the semiconductor substrate 13. The groove 103 comprises vertical sidewalls 69, 70 being perpendicular to the main surface 23. The gate electrode 83 faces at least one of the vertical sidewalls 69. A potential applied to the second gate electrode 83 controls the charge carrier distribution in a region of the second active area 43 directly adjoining the second gate dielectric 187, wherein, in a conductive state of the second field effect transistor 63, an inversion layer of minority charge carriers forms a conductive channel between the first and second source/drain regions 5, 6. The second channel in the second active area 43 extends in a vertical direction with respect to the horizontal main surface 23. A bottom 7 of the groove 103 may be substantially parallel to the main surface 23. A bottom diffusion area 75 below the bottom 7 may increase the electrical conductivity. On the bottom 7 of the groove 103, a source/drain contact 8 may be formed, (e.g., a metal source/drain contact). An insulator layer 9 may separate the source/drain contact 8 and vertical portions 10 of the gate electrode 83.

The second isolation structure 95 insulates the first field effect transistor 53 and the second field effect transistor 63. A distance between a lower edge of the second insulation structure 95 and the main surface 23 may be equal to or greater than the distance between the lower edge of the groove 103 and the main surface 23.

The second field effect transistor 63 may be formed, for example, by etching the groove 103 and forming the buried second source/drain region 6 using a tilted implant, solid-state diffusion etc. The source/drain contact 8 may be formed by a metal deposition with or without siliciding. An insulating material, for example a silicon oxide may be deposited and recessed to form the insulator layer 9. Thereafter a gate material or a layered gate stack may be deposited by a sequence of conformal deposition processes. The gate material or the gate stack may be patterned to form the gate electrode 83. Then, a further diffusion or implant may be performed to form the first source/drain region 5 aligned to the gate electrode 83.

According to a further embodiment, a first source/drain region of the first field effect transistor 53 and a second source/drain region of the second field effect transistor 63 may be directly coupled to each other and the first and the second gate electrodes 73, 83 may be connected to each other to form an inverter structure.

Figure 4A:
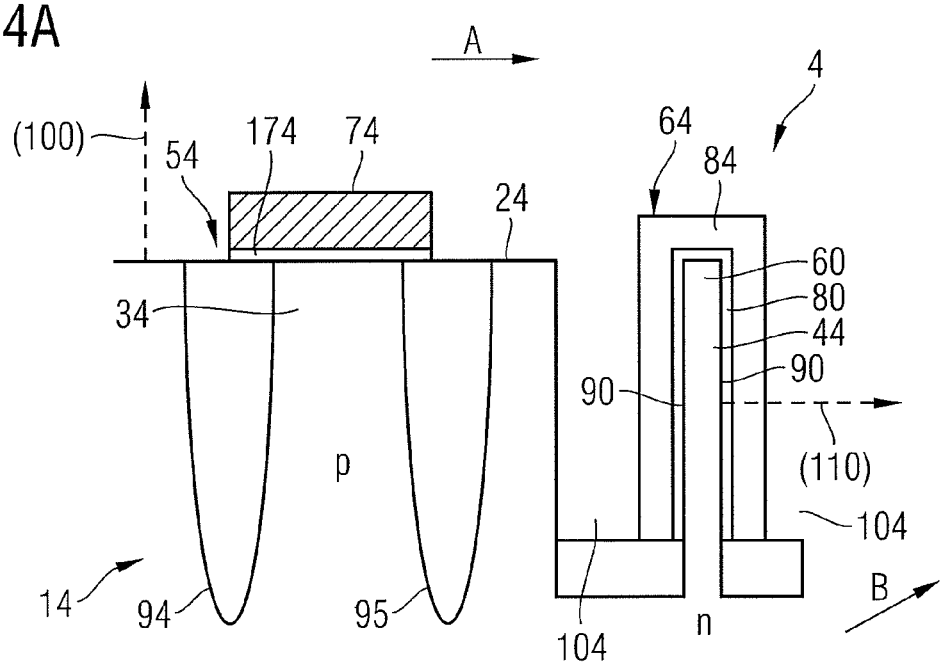
FIG. 4A illustrates a cross-sectional view of substrate portion that includes a planar p-FET and an n-FinFET in a {100}-surface according to yet another embodiment.
Figure 4B:
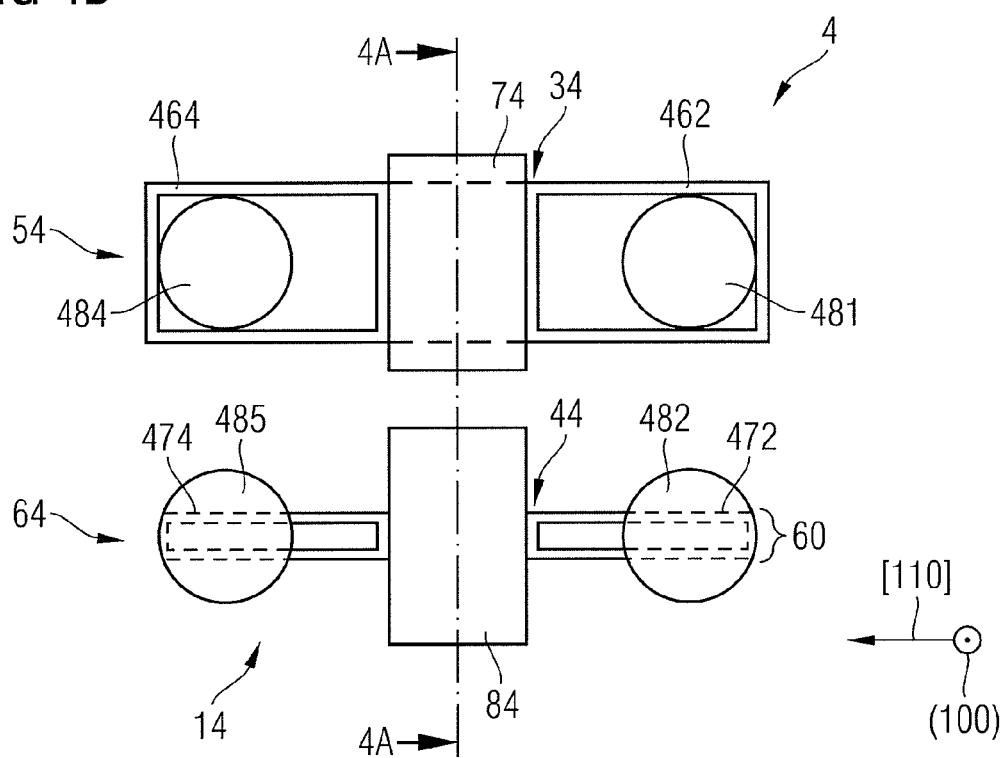
FIG. 4B illustrates a plan view of the substrate portion of FIG. 4A.

FIG. 4A refers to a cross-section along line 4A-4A of FIG. 4B and illustrates an integrated circuit 4 with a first field effect transistor 54, which may be a planar n-FET, and a FinFET 64, which may be a p-FinFET, formed in a main surface 24 of a semiconductor substrate 14 which may be a single crystalline silicon substrate or any other of the above described substrates. The main surface 24 is parallel to one of a first set of equivalent crystal planes of the semiconductor substrate 14. In the illustrated embodiment, the main surface 24 is oriented to the {100}-planes of the semiconductor substrate 14.

The first field effect transistor 54 of the integrated circuit 4 is configured to form, in a conductive state, a first channel oriented to the main surface 24. The first field effect transistor 54 is of a first carrier type (e.g., a planar n-FET similar to the first field effect transistor 53 of FIG. 3). In accordance with other embodiments, the first field effect transistor 54 is a planar p-FET. The first field effect transistor 54 comprises a first active area 34 with a first and a second source/drain region 462, 464. The active area 34 may be defined between first and second isolation structures 94, 95. A first gate electrode 74 of the first field effect transistor 54 may be disposed along the main surface 24 and is configured to control a first channel formed between the first and the second source/drain regions 462, 464 in the first active area 34. The first channel extends in a plane parallel to the main surface 24 and a current in the first channel flows along an axis perpendicular to the cross-sectional plane in the transistor on-state.

The FinFET 64 is configured to form, in a conductive state, a second channel oriented to a second set of equivalent crystal planes perpendicular to the first set. The FinFET 64 is arranged, for example, adjacent or in vicinity to the first field effect transistor 54, wherein an isolation structure 95 may separate the first field effect transistor 54 and the FinFET 64. The FinFET 64 is of a second, different carrier type, for example a p-FET. In other embodiments, the FinFET 64 can also be an n-FET. The active area 44 of the FinFET 64 comprises a portion in the shape of a fin 60. Vertical portions of a second gate electrode 84 of the FinFET 64 are arranged in grooves 104 formed in the semiconductor substrate 14. The fin 60 is disposed as a vertical bar between the grooves 104. A gate dielectric 80 extends along vertical sidewalls of the fin 60, may wrap around the fin 60 and may cover two sidewalls on opposing sides of the fin 60 and the upper edge of the fin 60, which may be flat, inwardly or outwardly bowed or acute. A gate electrode 84 may extend along the gate dielectric 80. Sidewalls 90 of the fin 60 may be oriented to {110}-planes of the semiconductor substrate 14 as illustrated.

The second gate electrode 84 is configured to control a second channel formed between first and second source/drain regions 472, 474 in the second active area 44. The second channel extends in a plane vertical to the main surface 24 and perpendicular to the cross-sectional plane. A channel current flows along an axis perpendicular to the cross-sectional plane in a transistor on-state. The second channel is oriented to a second different set of equivalent crystal planes of the semiconductor substrate 14.

According to the plan view illustrated in FIG. 4A, the first and second source/drain regions 462, 464 of the first field effect transistor 54 face each other on opposing sides of the first gate electrode 74. The first and second source/drain regions 472, 474 of the FinFET 64 face each other on opposing sides of the second gate electrode 84. Each source/drain region 462, 464, 472, 474 is electrically contacted with an electrical contact 481, 482, 484, 485, respectively. The first gate electrode 74 is formed between the first and second source/drain regions 462, 464 of the first field effect transistor 54 and the second gate electrode 84 is formed between the first and second source/drain regions 472, 474 of the FinFET 64.

According to a further embodiment, a first source/drain region of the first field effect transistor 54 and a second source/drain region of the FinFET 64 may be connected, and the first and the second gate electrodes 74, 84 may be connected to each other to form an inverter structure.

Integrated circuits as described with reference to the Figures provide surfaces with different crystal orientation for the simultaneous formation of field effect transistors with channels being oriented to different crystallographic planes on the same semiconductor substrate. Accordingly, high-performance integrated circuits, for example, with matched complementary FETs, can be fabricated without complex wafer bonding and mixed crystal techniques. The formation of grooved or sidewall devices facilitates a small device foot print. V-shaped devices as described with regard to FIG. 1A to 2B may be realized via a simple orientation-selective etch process like a masked KOH-etch having different etch rates in different crystal orientations of the respective semiconductor substrate. Surface orientation dependent etch rates can be utilized to form various embodiments of integrated circuits.

According to an embodiment, in an integrated circuit a planar n-FET with a channel plane parallel to the {100}-plane and a current flow within the channel along a [100]-direction is combined, on the same semiconductor substrate, with a p-FET oriented to a groove having 45°-tilted sidewalls in relation to the main surface, wherein the sidewalls are {110}-planes and a current in the channel flows along the [110]-direction.

According to another embodiment, in an integrated circuit a planar n-channel field effect transistor on a (100) semiconductor substrate is combined, on the same semiconductor substrate, with a p-channel field effect transistor formed on a sidewall of a groove wherein the sidewall is a {110}-plane and a current in the p-channel flows along a [110]-direction.

According to a further embodiment, in an integrated circuit a planar p-channel field effect transistor on a (111) semiconductor substrate is combined, on the same semiconductor substrate, with an n-channel field effect transistor formed on a {100}-plane, wherein a channel current flows along a [110]-direction; or a p-channel field effect transistor as a planar device on a (111) semiconductor substrate combined, on the same semiconductor substrate, with an n-channel field effect transistor having an orthogonal gate.

In all embodiments, the gate electrodes 71, 81; 72, 82; 73, 83; 74, 84 may run in parallel to each other. Furthermore, for example, the gate electrodes 71, 81; 72, 82; 73, 83; 74, 84 may run orthogonal to each other.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An integrated circuit, comprising:
   a first field effect transistor comprising a first channel oriented to one of a first set of equivalent crystal planes of a semiconductor substrate, the first set being parallel to a main surface of the semiconductor substrate; and
   a second field effect transistor comprising a second channel at least a portion of which is oriented to a second set of parallel crystal planes of the semiconductor substrate, the second set being tilted with reference to the main surface, the second field effect transistor being separated from the first field effect transistor by an isolation structure in a first cross-section that is perpendicular to the main surface and that extends along a first direction extending between the first and second channels;
   wherein the second channel is configured to provide a path for current flow between first and second source/drain regions of the second field effect transistor in a second direction perpendicular to the first cross-section and parallel to the intersection lines of the first and second sets of parallel crystal planes; and
   wherein the first channel configured to provide a path for current flow between first and second source/drain regions of the first field effect transistor in the second direction such that the first and second channels are configured to provide paths for current flow along a same crystal axis but on crystal planes of different orientation.

2. The integrated circuit of claim 1, wherein the second set of parallel crystal planes is tilted at an angle of 45 degrees to the main surface.

3. The integrated circuit of claim 1, wherein the first field effect transistor is of a first carrier type and the second field effect transistor is of a second carrier type, the second carrier type being different from the first carrier type.

4. The integrated circuit of claim 1, wherein the second channel comprises a further portion oriented to one of a third set of parallel crystal planes, the third set being equivalent to the second set and the channel portion extending along sidewalls of a V-shaped groove defined in the main surface.

5. The integrated circuit of claim 1, wherein the main surface is oriented to a {100}-plane and the first field effect transistor is an n-channel field effect transistor.

6. The integrated circuit of claim 1, wherein the main surface is oriented to a {111}-plane and the first field effect transistor is a p-channel field effect transistor.

7. The integrated circuit of claim 1, wherein one of the first and second source/drain regions of the first field effect transistor is electrically coupled with one of the first and second source/drain regions of the second field effect transistor.

8. The integrated circuit of claim 1, wherein the second field effect transistor comprises a FinFET.

9. The integrated circuit of claim 4, wherein a gate electrode of the second field effect transistor is arranged in the V-shaped groove.

10. An integrated circuit, comprising:
a first field effect transistor comprising first and second source/drain regions and a first gate electrode disposed along a main surface of a semiconductor substrate adjacent to a first channel configured to provide a current flow path between the first and second source/drain regions in a direction of current flow; and
a second field effect transistor comprising first and second source/drain regions and a second gate electrode disposed in a groove disposed in the semiconductor substrate adjacent to a second channel configured to provide a current flow path between the first and second source/drain regions of the second field effect transistor in the direction of current flow, the groove comprising a first sidewall disposed along a first crystal plane and a second sidewall disposed along a second crystal plane in a cross-section extending along a first direction between the first and second gate electrodes;
wherein the direction of current flow in the first and second channels is perpendicular to the cross section extending along the first direction.

11. The integrated circuit of claim 10, wherein the main surface is oriented to one of a first set of equivalent crystal planes comprising a (110)-crystal orientation and a (111)-crystal orientation and at least one sidewall of the groove is oriented to one of a second set of equivalent crystal planes, the second set of equivalent crystal planes being different from the first set of equivalent crystal planes.

12. The integrated circuit of claim 10, wherein the first sidewall of the groove is tilted at an angle of 45 degrees in relation to the main surface.

13. The integrated circuit of claim 10, wherein the main surface is oriented along a {111}-plane and the first field effect transistor is a p-channel field effect transistor.

14. The integrated circuit of claim 10, wherein one of the first and second source/drain regions of the first field effect transistor is connected to one of the first and second source/drain regions of the second field effect transistor.

15. The integrated circuit of claim 10, wherein the second field effect transistor comprises a FinFET.

* * * * *